US010145929B2

(12) United States Patent
Stemmer (10) Patent No.: US 10,145,929 B2
(45) Date of Patent: Dec. 4, 2018

(54) METHOD AND MAGNETIC RESONANCE APPARATUS FOR GENERATING A PARAMETER MAP TO COMPENSATE LOCAL INHOMOGENEITIES IN THE BASIC MAGNETIC FIELD

(71) Applicant: Siemens Aktiengesellschaft, Munich (DE)

(72) Inventor: Alto Stemmer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 658 days.

(21) Appl. No.: 14/731,767

(22) Filed: Jun. 5, 2015

(65) Prior Publication Data

US 2015/0355306 A1     Dec. 10, 2015

(30) Foreign Application Priority Data

Jun. 5, 2014   (DE) .......................... 10 2014 210778

(51) Int. Cl.
*G01V 3/00*         (2006.01)
*G01R 33/54*        (2006.01)
(Continued)

(52) U.S. Cl.
CPC ..... *G01R 33/56563* (2013.01); *G01R 33/243* (2013.01); *G01R 33/46* (2013.01);
(Continued)

(58) Field of Classification Search
CPC .... G01R 33/543; G01R 33/46; G01R 33/561; G01R 33/243; G01R 33/583;
(Continued)

(56) References Cited

U.S. PATENT DOCUMENTS 5,237,273 A * 8/1993 Plewes ............... G01R 33/4835
324/307
6,118,237 A   9/2000 Kikuchi et al.
(Continued)

FOREIGN PATENT DOCUMENTS

CN         103513202 A    1/2014

OTHER PUBLICATIONS

Xu et al., "Correcting Bo Induced Signal Loss Using Echo Planar Imaging Reference Data," Proc. Intl. Soc. Mag. Reson. Med., vol. 19 (2011), p. 2689.
(Continued)

*Primary Examiner* — Minh N Tang
(74) *Attorney, Agent, or Firm* — Schiff Hardin LLP (57) ABSTRACT

In a method and a controller for generating a parameter map for a target volume in an examination object, that represents a field deviation from the resonance frequency of a first spectral component of tissue of object in a magnetic resonance tomography scanner, a spatial region of the object, which includes at least the target volume, is excited. At least three echo signals are formed, wherein a first echo time difference between two the echo signals is chosen such that the phase evolutions of the signals of a second spectral component of the tissue differ, during the first echo time difference, from the first spectral component substantially by $2\pi$, and an echo time of at least a further one of the echo signals is chosen such that it lies between the echo times of the two echo signals having the first echo time difference. Raw data are then acquired from the three echo signals, and the parameter map is then generated therefrom.

14 Claims, 4 Drawing Sheets

(51) Int. Cl.
*G01R 33/565* (2006.01)
*G01R 33/46* (2006.01)
*G01R 33/48* (2006.01)
*G01R 33/561* (2006.01)
*G01R 33/24* (2006.01)
G01R 33/3875 (2006.01)
G01R 33/58 (2006.01)

(52) U.S. Cl.
CPC ....... *G01R 33/4818* (2013.01); *G01R 33/543* (2013.01); *G01R 33/561* (2013.01); *G01R 33/3875* (2013.01); *G01R 33/583* (2013.01)

(58) Field of Classification Search
CPC ............ G01R 33/4835; G01R 33/4824; A61B 5/055; A61B 5/417
See application file for complete search history.

(56) References Cited

U.S. PATENT DOCUMENTS

| | | |
|---|---|---|
| 2005/0242808 A1 | 11/2005 | McKendry et al. |
| 2009/0015257 A1 | 1/2009 | Hughes |
| 2009/0093704 A1* | 4/2009 | Ma .................. A61B 5/417 600/410 |
| 2013/0249548 A1* | 9/2013 | Stemmer ............ G01R 33/4835 324/309 |
| 2013/0281828 A1 | 10/2013 | Stemmer |
| 2014/0117985 A1 | 5/2014 | Grodzki |
| 2014/0126795 A1 | 5/2014 | Zhong et al. |

OTHER PUBLICATIONS

Reber et al., "Correction of Off Resonance-Related Distortion in Echo-Planar Imaging Using EPI-Based Field Maps," Magnetic Resonance in Medicine, vol. 39 (1998), pp. 328-330.

Windischberger et al., "Robust Field Map Generation Using a Triple-Echo Acquisition," Magnetic Resonance Imaging, vol. 20 (2004), pp. 730-734.

Morrell et al., "Dynamic Shimming for Multi-Slice Magnetic Resonance Imaging," Magnetic Resonance in Medicine, vol. 38 (1997), pp. 477-483.

Funai et al., "Regularized Field Map Estimation in MRI," IEEE Transactions on Medical Imaging, vol. 27, No. 10 (2008), pp. 1484-1494.

Abdul-Rahman et al., "Robust three-dimensional best-path phase-unwrapping algorithm that avoids singularity loops," Applied Optics, vol. 48, No. 23 (2009), pp. 4582-4596.

* cited by examiner

FIG 2 (PRIOR ART)

METHOD AND MAGNETIC RESONANCE APPARATUS FOR GENERATING A PARAMETER MAP TO COMPENSATE LOCAL INHOMOGENEITIES IN THE BASIC MAGNETIC FIELD

BACKGROUND OF THE INVENTION

Field of the Invention

The invention concerns a method and magnetic resonance apparatus for generating a parameter map that, for a target volume in an examination object, represents a field deviation from the resonance frequency of a spectral component of examination tissue of the examination object in a magnetic resonance tomography system (MR system).

Description of the Prior Art

The invention also concerns a method for generating magnetic resonance image data of a target volume in an examination object by the operation of a magnetic resonance tomography system, in which a parameter map generated in this way is used for shimming a $B_0$ field of the magnetic resonance tomography system and/or for determining a current operating frequency of the magnetic resonance tomography system. The invention also concerns a controller for a magnetic resonance tomography system for implementing such a method and to a magnetic resonance tomography system having such a controller.

In a magnetic resonance tomography system, the body to be examined is conventionally exposed in a scanner, having a basic field magnet, to a relatively high basic magnetic field, having a field strength, for example, of 1.5 tesla, 3 tesla or 7 tesla. By the application of the basic field, nuclei in the examination object align according to their nuclear magnetic dipole moment, frequently also called spin, along the field. This collective behavior of the spin system is described as macroscopic magnetization. The macroscopic magnetization is the vector sum of all microscopic magnetic moments in the object at a specific location. In addition to the basic field a magnetic field gradient is applied by a gradient system. The magnetic resonance frequency (Larmor frequency) applicable at the respective location is directly proportional to the total magnetic field (known as the $B_0$ field) that is present at the respective location due to the superimposition of the basic magnetic field and the gradient magnetic field. Radio-frequency excitation signals (RF pulses) are then emitted by a radio-frequency transmitting system by means of suitable antenna devices, and this leads to the nuclear spins of specific nuclei that are resonantly excited (i.e. at the Larmor-frequency present at the respective location) by this radio-frequency field being tilted by a defined flip angle with respect to the magnetic field lines of the basic magnetic field. If an RF pulse of this kind acts on spins that have already been excited, then these can be tilted into a different angular position or even be deflected back into an initial state parallel to the basic magnetic field. When the excited nuclear spins are relaxed, radio-frequency signals, known as magnetic resonance signals, are resonantly emitted, and these are received by suitable receiving antennae. After demodulation and digitization and possibly further processing steps, the received signals are in the form of complex numbers, called raw data. The magnetic resonance signals are acquired in the spatial frequency domain, known as k-space, and the raw data are entered into a memory representing in a timed k-space sequence of data entry points along a "gradient trajectory" (also called "k-space trajectory") defined by the switching of the gradient pulses during a measurement. The RF pulses must be emitted so as to be appropriately coordinated in time with the gradient activations. The desired image data (MR images) can be reconstructed from the raw data acquired in this way. This image reconstruction frequently includes a two-dimensional Fourier transformation.

Specific, predefined pulse sequences are conventionally used to activate a magnetic resonance tomography system during the measurement, i.e. sequences of defined RF pulses and gradient pulses in different directions, and readout windows, during which the receiving antennae are switched to a receive state and the magnetic resonance signals are thus received and processed. With the use of what is known as a measurement protocol, these sequences are parameterized in advance for a desired examination, for example to give a specific contrast to the calculated images. The measurement protocol can also include further control data for the measurement. There are many magnetic resonance sequence techniques according to which pulse sequences can be established.

Many magnetic resonance technologies or measuring methods, such as spectral fat suppression, or fast imaging methods, such as EPI (Echo Planar Imaging) or spiral techniques, make high demands on the homogeneity of the $B_0$ field. Each individual body of each patient disturbs the local magnetic field differently. To nevertheless be able to use such methods, in practice a technique known as in-vivo shimming (a field adjustment with the patient positioned in the device) is often carried out patient-specifically. In this shimming, first the local $B_0$ field (i.e. the field present at the respective image point) in the examination region is measured to create a record known as a $B_0$ map, as mentioned in the introduction. DC offset currents are then calculated from the $B_0$ map for the three gradient coils (i.e. the linear shim terms or terms of the field deviation) as well as currents for specific shim channels (or shim coils) of a higher order which compensate the local field distortions in the best possible way. After adjusting these currents an RF resonance frequency is ascertained as a rule in a frequency adjustment for the desired spectral component of the examined tissue (usually protons bound to water) which are then specified to the components of the system, in particular the RF transmitting system and the RF receiving system as the operating frequency in order to emit RF pulses with the appropriate carrier frequency $f_0$ and receive magnetic resonance signals.

In the case of a measurement known from practice for adjusting a $B_0$ map, two complex MR images are measured at different echo times $T_1$ and $T_2$ for example with a double echo gradient sequence or DESS (Double Echo Steady State) sequence to calculate the local off-resonance frequency $\Delta f(x,y,z)$ (i.e. the deviation from the resonance frequency) from the phase of the difference image at location $(x,y,z)$ (i.e. a phase difference map $\Delta\Phi_H(x,y,z)$):

$$\Delta f(x, y, z) = \frac{\Delta\Phi(x, y, z)}{2\pi(T_2 - T_1)} \qquad (1)$$

This method is based on the assumption that the phase accumulation between the two echo times is solely a consequence of the local deviation from the RF resonance frequency (RF center frequency). With a presence of a plurality of spectral components (i.e. components in examination tissues with different resonance frequencies) this assumption is only correct if the relative phase position of the relevant spectral components does not change between the two echo times. In the case of just two dominant spectral components this may be achieved by choosing the echo time difference in such a way that the phase evolution of one component is a multiple of $2\pi$ compared with the other component between the two echo times. The two dominant spectral components in the proton imaging most used in practice are protons bound to water and fat. Their resonance frequencies are shifted by roughly 3.2 to 3.4 ppm ("parts per million") with respect to each other, in a magnetic field of 1.5 T by approx. $\Delta f_c=204$ Hz therefore and at 3 T by approx. $\Delta f_c=408$ Hz ("c" stands for "chemical shift"). This in turn corresponds to a minimum echo time difference of 4.86 ms at 1.5 T and 2.43 ms at 3 T.

As a consequence of the $2\pi$ periodicity of the arc tan 2 function, with the aid of which the phase can be determined from the complex difference image, this choice of the echo times according to equation (1) unavoidably limits the maximum off-resonance frequency $\Delta f(x,y,z)$, which can be clearly determined using this method, to $\pm\Delta f_c/2$, i.e. to approx. $\pm 102$ Hz at 1.5 T and $\pm 204$ Hz at 3 T. Higher off-resonances (i.e. deviations from the resonance frequency) lead to what are known as phase wraps in the calculated $B_0$ maps.

The off-resonances that actually occur are usually larger. The $B_0$ maps determined using the method therefore exhibit phase wraps as a rule. In practice, only the DC offset currents are therefore currently ascertained from the $B_0$ maps for the gradient coils and the higher shim currents. Methods are known in practice for this purpose which function robustly even in the presence of phase wraps. The new resonance frequency is in practice usually ascertained following the adjustment of these shim currents using a spectroscopic method, i.e. the Fourier analysis of an MR signal, which is received without simultaneous switching of gradients. This separate adjustment step is also called a "frequency adjustment". Generally only one frequency for the entire measuring volume is ascertained. Due to the long repetition time of the sequences used for the spectroscopic method, such as STEAM ("stimulated echo acquisition mode"), a spatially resolved frequency adjustment would be very time-consuming.

The article that appeared in the journal MRM 38 on pages 477-483 1997 "Dynamic shimming for Multi-Slice Magnetic Resonance Imaging" by Glen Morrell and Daniel Spielman proposes measuring a $B_0$ map using a double echo-gradient echo sequence. Fat-water errors are prevented by appropriate choice of the echo time difference and the spectral range of the $B_0$ map is expanded by phase unwrapping ("phase unwrapping"). However, the $B_0$ map then always still contains an unknown global offset.

A further example of a double echo method in the prior art is the ISMRM 2011 Abstract by Dan Xu et al. with program number 2689. There it is proposed to determine the local frequency from two reference scans which are acquired in echo planar-imaging for phase correction. Xu et al do not discuss the problems that result due to the presence of various spectral components in the examination tissues.

SUMMARY OF THE INVENTION

It is an object of the present invention to provide a suitable, optimally simple and fast method for generating a parameter map and a corresponding controller for a magnetic resonance tomography system in which a separate frequency adjustment is no longer necessary.

In accordance with the invention, a spatial region of the examination object is excited which includes at least the target volume, and—by switching suitable read gradients—at least three echo signals are formed. According to the invention, a first echo time difference is chosen between two of the at least three echo signals such that the phase evolutions of the signals of the first spectral component differ from those of a second spectral component of the examination tissue of the examination object during the first echo time difference substantially by $2\pi$, and an echo time of at least a further one of the at least three echo signals is chosen such that it lies between the echo times of the two echo signals with the first echo time difference. "Substantially" as used herein means that the phase evolutions of the spectral components do not have to differ exactly by $2\pi$ over their entire spectral range but this difference may range in accordance with the spectral distribution of the relevant component (for example in the case of fat) in a certain interval around $2\pi$. Raw data are acquired from the three echo signals in each case. In other words, at least one, preferably spatially selective, excitation pulse is emitted and suitable gradient pulses are used in a compatible manner and readout windows are set (i.e. the RF receiving system activated) to generate the echo signals at the desired echo times and readout the raw data. The parameter map is then generated by using raw data of all three echo signals. The target volume can be a two-dimensional slice, but also a three-dimensional volume.

The invention is based on the insight that it is possible to form and scan (to acquire raw data) multiple intermediate echoes between the two echoes with a predefined echo time difference, and to then process and combine this data so that a parameter map can be ascertained therefrom, not only for calculating the shim currents but also for determining a current operating frequency of the magnetic resonance tomography system. A separate frequency adjustment is therefore not needed.

As is explained below with reference to examples, the invention provides a method with which the frequency range of the frequency deviation from the resonance frequency, which can be clearly resolved with the use of the parameter map (for example $B_0$ map), can be increased by an integral factor without the acquisition period of the parameter map being increased, wherein the result is not falsified by the presence of two spectral components (for example fat and water). The size of the factor is inversely proportional to the desired spatial resolution of the $B_0$ map, and for example, in a Siemens MAGNETOM Skyra 3 T system with unchanged resolution of the B0 maps is for example four. In 1.5 T systems with a corresponding gradient system, it is even twice the size.

As used herein, a parameter map is taken to mean spatially resolved details of a specific parameter, i.e. dependent on the respective image point or point of the map, such as pixels or voxels. As will be explained later, a parameter map, which represents a field deviation of this kind, can be a $\Delta B_0$ map, i.e. the direct indication of the absolute $B_0$ field deviation from the $B_0$ field adjusted in the measurement of the parameter map in the MR system, but also a $B_0$ map (the location-dependent absolute field distribution), a $\Delta\Phi$ map (a spatially resolved indication of a phase or phase change or deviation, usually also called a "phase difference map" or "phase map" for short), a $\Delta f_0$ map (the distribution of the deviation from the resonance frequency for water for example) or any other map, whose values are proportional to this field deviation and/or may simply be converted by deducting or adding a known constant value from/to a $\Delta B_0$ map of this kind. Unless explicitly mentioned otherwise, one of the specifically mentioned parameter maps ($\Delta B_0$ map, $\Delta\Phi$ map, $\Delta f_0$ map) can hereinafter be regarded in particular without limitation as a synonym for the other parameter maps which represent said field deviation. A parameter map of this kind can be two- or three-dimensional. Since a parameter map of this kind—as explained below—is used for adjustment of the MR system for a subsequent (in particular diagnostic) measurement, it may also be called an "adjustment parameter map". However, for shorter notation the simplified term "parameter map" will be retained.

Fast and simple measurement in the inventive manner has the following additional advantages:

The local B0 field disadvantageously varies not only patient-specifically but also dynamically, in particular in the vicinity of moving organs (for example respiratory organs) and as a consequence of heating during the course of the examination. Compensation of this dynamic field variation would require repeated measurement of the $B_0$ map, subsequent re-calculation of the shim currents, adjustment of these factors, and ascertainment of the new resonance frequency or operating frequency. All of this should occur on a time scale that is small compared to the typical time constants of the B0 field fluctuation (for example a breathing interval in the example of breathing). Dynamic shimming of this kind, which in contrast to in-vivo shimming cannot be implemented in the clinical MR devices that are currently commercially available, would be possible with the inventive method.

It is also known that the compensation of the local field distortions acts more completely the smaller the target volume is in which the field characteristic should be homogenized. In (2D-)multi-slice measurements it is therefore expedient to separately ascertain the optimum shim currents and an optimum resonance frequency for each slice and to adjust these before acquisition of the respective slice. Rapid changeover of the shim currents and resonance frequency to the runtime of the sequence, to a sequence-dependent timescale of a few milliseconds up to a few seconds is also required here. This slice-specific shimming is not implemented in the clinical MR devices that are currently commercially available either, but could be implemented with the inventive method.

In an inventive method for generating a diagnostic image from magnetic resonance image data of an examination object with the use of a magnetic resonance tomography system, a parameter map is generated with the previously defined inventive method. Using the parameter map, a $B_0$ field of the magnetic resonance tomography system is then shimmed and/or a current operating frequency of the magnetic resonance tomography system is determined. The shim volume or the volume to be shimmed often does not match the target volume. Preferably, for example, multiple target volumes, in particular slices, can be combined to form a parameter map volume for which an overall parameter map is determined. Any part of the parameter map volume can then be chosen as the shim volume. In a subsequent acquisition of diagnostic magnetic resonance data from the target region, preferably the shim volume is then excited for the acquisition of diagnostic raw data using the operating frequency and the magnetic resonance image data forming the diagnostic image are reconstructed on the basis of the raw data. If multiple slices are successively excited for imaging, the individual slices can also form separate shim volumes. In particular the target volumes and shim volumes can (but do not have to) then also match. A "diagnostic image" means an image of sufficient quality so as to allow a reliable medical diagnosis to be made upon evaluation of the image.

An inventive controller of the type described initially has a sequence control module that is designed such that it activates the further components (mentioned below) of the magnetic resonance tomography system in the inventive manner described above for the acquisition of raw data from the at least three echo signals. The controller also has an evaluation module that is designed to ascertain the parameter map in the inventive manner using raw data of the three echo signals.

An inventive magnetic resonance tomography system has the following components:

a basic field magnetic system in order to apply a homogenous basic magnetic field in a measuring space, in which the examination object is located;

an RF transmitting antenna system in order to emit the radio-frequency pulses into the examination object;

a gradient system, in order—as described above—to apply, by switching gradient pulses, additional time-limited gradient fields (i.e. to use gradient pulses);

an RF receiving antenna system in order to detect the magnetic resonance signals from the examination object. The RF transmitting antenna system and the RF receiving antenna system can be different antennae systems or the same antenna system.

The magnetic resonance tomography system also has an inventive controller as described above, that, during operation activates the basic field magnetic system, the RF transmitting antenna system, the gradient system and the RF receiving antenna system for generating magnetic resonance slice recordings of an examination object. For this purpose the controller can have, for example, various sub-components, such as a radio-frequency transmitter for transmitting radio-frequency pulses to the RF transmitting antenna system, a gradient system interface for activation of the gradient system, a radio-frequency receiver for generating the raw data from the signals received via the RF receiving antenna system, and the aforementioned sequence control unit that, during operation, sends measuring sequence control data to the radio-frequency transmitter, the gradient system interface and the radio-frequency receiver, so, as described above, the data activate the RF transmitting antenna system, the gradient system, the radio-frequency receiver and the RF receiving antenna system in the inventive manner for acquisition of the raw data.

Basic parts of the controller are preferably implemented in the form of software on a suitable programmable controller with corresponding storage options. This applies in particular to the sequence control unit. The radio-frequency transmitter, gradient system interface and radio-frequency receiver can also at least partially be implemented in the form of software units, wherein other units of these components can in turn be pure hardware units, by way of example the radio-frequency amplifier, radio-frequency transmitter, a gradient pulse-generator of the gradient system interface or an analogue-to-digital converter of the radio-frequency receiver, etc. An extensive implementation in terms of software, in particular of the sequence control unit, has the advantage that magnetic resonance system controllers that have already been used to date can also be easily be upgraded by way of a software update in order to work in the inventive manner.

The above object also is achieved in accordance with the invention by a non-transitory, computer-readable data storage medium that can be loaded directly into a memory of a programmable controller. The storage medium is encoded with programming instructions that cause all steps of the inventive method to be executed in the controllers.

With the inventive method a first auxiliary parameter map (preferably a phase difference map or phase map or a "phase image") is ascertained or calculated from the raw data of the two echo signals with the first echo time difference, in which map the two spectral components (for example water and fat) are aliased. This parameter map has, as explained above in connection with equation (1), a relatively small, limited frequency value range or phase value range of for example only max. ±π (frequency value range and phase value range may, as mentioned, be converted into each other, so these terms are also used synonymously within the context of the invention). In other words, the corresponding frequency parameter map is spectrally resolved by way of example only from approx. −102 Hz to approx. +102 Hz on a 1.5 T system or approx. −204 Hz to +204 Hz on a 3 T system.

Furthermore, a second auxiliary parameter map can be ascertained or calculated from raw data of at least three echo signals, i.e. with the use of the intermediate echo signals. This second auxiliary parameter map is preferably of the same type as the first auxiliary parameter map (i.e. preferably again a phase difference map), but preferably has a greater frequency value range (for example ±204 Hz at 1.5 T, ±408 Hz at 3 T) or phase value range, for example ±2π or even greater, compared thereto. This second auxiliary parameter map can be spectrally resolved by way of example from −2π to +2π. Advantageously this second auxiliary parameter map does not have any aliases. Since the above-mentioned condition for the echo time difference is not met here, it cannot be discerned whether the local changes in the phase differences are caused by field deviations or different spectral components. Reference is made to the fact that the value range is always greater than the frequency deviation due to the chemical shift of the spectral components involved. This follows immediately from equation (1), since the echo time difference of the intermediate echo is less than the first echo time difference which leads to aliasing of the two spectral components. In the second auxiliary parameter map, if it is for example a phase difference map, the phase is not only a function of the local $B_0$ deviation at location (x,y,z), but also the chemical composition of the pixel/voxel at location (x,y,z). This is not known from conventional techniques.

Various possibilities exist in order to be able to ascertain the desired parameter map from a first auxiliary parameter map of this kind with a lower frequency value range and with aliasing, and a second auxiliary parameter map with a greater frequency value range without aliasing. This can be done without the possibility of distinguishing whether the deviations in the map are to be attributed to field deviations or different spectral components. For example, the parameter map can be an absolute frequency map with a high frequency value range.

Since phase wrapping (aliasing) in the first auxiliary parameter map with a lower frequency value range generally do not coincide with interfaces between map points (i.e. pixels or voxels of the respective parameter map), which are dominated by different spectral components, a value jump between two neighboring pixels, for example a phase jump in a phase difference map, which occurs only in the first auxiliary parameter map, can indicate phase wrapping. This knowledge may be used advantageously, for example, to unwrap the first auxiliary parameter map. Conversely, a significantly greater value jump or phase jump between two neighboring pixels in the second auxiliary parameter map (with the greater frequency value range) can even identify an interface between map points which are dominated by different spectral components. A desired parameter map thus can be combined, for example, from the two auxiliary parameter maps, wherein the two auxiliary parameter maps are analyzed for value jumps, in particular by a comparison of the two auxiliary parameter maps. The discovered effects, i.e. aliases and chemical shifts, can then be eliminated in the sought parameter map locally or point for point.

In a preferred embodiment, phase wrapping in the first auxiliary parameter map have the lower frequency value range or phase value range are "phase-unwrapped" or "unwrapped" for short. This can occur, for example, with the use of a standard phase unwrapping algorithm. An overview of known phase unwrapping algorithms can be found, for example, in the Introduction to the journal article "Robust three-dimensional best-path phase-unwrapping algorithm that avoids singularity loops", by H. Abdul-Rahman et al., which appeared in the journal Applied Optics, 48 (23). pp. 4582-4596. ISSN 0003-6935 in 2009.

The sought parameter map with the absolute $B_0$ deviation, frequency, etc. can then be determined on the basis of the phase-unwrapped first auxiliary parameter map and the second auxiliary parameter map.

To facilitate or accelerate the calculations with the auxiliary parameter maps, the first auxiliary parameter map and/or the second auxiliary parameter map can preferably mask those pixels in the target volume that mainly contain noise. This can particularly preferably occur using magnitude image data of the target volume generated from the raw data of the echo signals. In this way the noise outside of the region of interest is easily eliminated and does not need to be taken into account further, in particular in said phase unwrapping.

In a preferred variant, the first auxiliary parameter map and/or the second auxiliary parameter map, is/are also subjected, before phase unwrapping to a linear phase correction. A linear phase correction of this kind makes the respective auxiliary parameter map smoother, so in particular a simpler, less powerful phase unwrapping algorithm may also be used without problems for phase unwrapping of the first auxiliary parameter map.

As mentioned, after phase unwrapping the phase for example at the individual map points can be gathered relative to each other (and therewith the relative characteristic of the $B_0$ field) from the first auxiliary parameter map. To determine the absolute $B_0$ field or absolute frequency, and therefore the sought parameter map, the absolute phase can then be determined with the aid of the second auxiliary parameter map having the greater frequency value range. The relative phase characteristic differs from the absolute phase characteristic by a global multiple of 2π. This multiple, as described in more detail below, can be determined with the use of the second auxiliary parameter map, and can be added, for example, to the phase response. The offset frequency (and therewith the $B_0$ field) is therefore also known over the entire target volume.

More generally, for calculation of the parameter map from the phase-unwrapped first auxiliary parameter map firstly a "global offset value" (for example the above-mentioned multiples of 2π of the phase characteristic) is preferably therefore ascertained, wherein global means that the offset value applies to the entire target volume independently of location. As soon as this global offset value is known, the desired parameter map can be simply calculated.

In a preferred approach, the global offset value is determined on the basis of a number of "candidate offset values" which are ascertained for various parameter map points using the second auxiliary parameter map. For this purpose, at least one, but preferably a number of, parameter map point(s), in the extreme case even all, in particular non-masked, parameter map points of the target volume, is/are used.

A candidate offset value for a phase parameter map point can be determined as follows.

If the second spectral component has a lower resonance frequency than the first spectral component, a candidate offset value for a parameter map point can be determined in such a way that the value of the phase-unwrapped first auxiliary parameter map present at this parameter map point after addition of the candidate offset value does not fall below the value of the second auxiliary parameter map at this parameter map point and exceeds, by a maximum, a value which corresponds to a phase of $2\pi$, and the candidate offset value itself corresponds to an integral multiple of the phase $2\pi$.

If the second spectral component has a higher resonance frequency than the first spectral component, a candidate offset value for a parameter map point can accordingly be determined in such a way that the value of the phase-unwrapped first auxiliary parameter map present at this parameter map point after addition of the candidate-offset value does not exceed the value of the second auxiliary parameter map at this parameter map point and falls below, by a maximum, a value which corresponds to a phase of $2\pi$, and again the candidate offset value itself corresponds to an integral multiple of the phase $2\pi$.

From the adjustment parameter map finally ascertained according to the invention, the current operating frequency for the target volume or parameter map volume or shim volume can then be determined for an immediately subsequent measurement to generate diagnostic (useful) image data individual to the patient in the target volume or a parameter map volume comprising a plurality of target volumes, or a shim-volume incorporated thereby (see the above statements in this regard). In the case of the local shimming mentioned above the shim-volume is for example an individual 2D-slice in a multi-slice 2D measurement. In a preferred variant the current operating frequency can be determined on the basis of a weighted mean parameter, for example the local phase deviation, or the frequency deviation within the shim volume.

DESCRIPTION OF THE PREFERRED EMBODIMENTS

In the following examples it will be assumed for simplicity, and without limiting the generality, that 2D slice measurements are being considered (therefore the image points or parameter map points will also be called pixels) and that a $\Delta B_0$ map is ascertained as (adjustment) parameter map and the auxiliary parameter maps are each phase difference maps ($\Delta \Phi$ maps).

Figure 1:
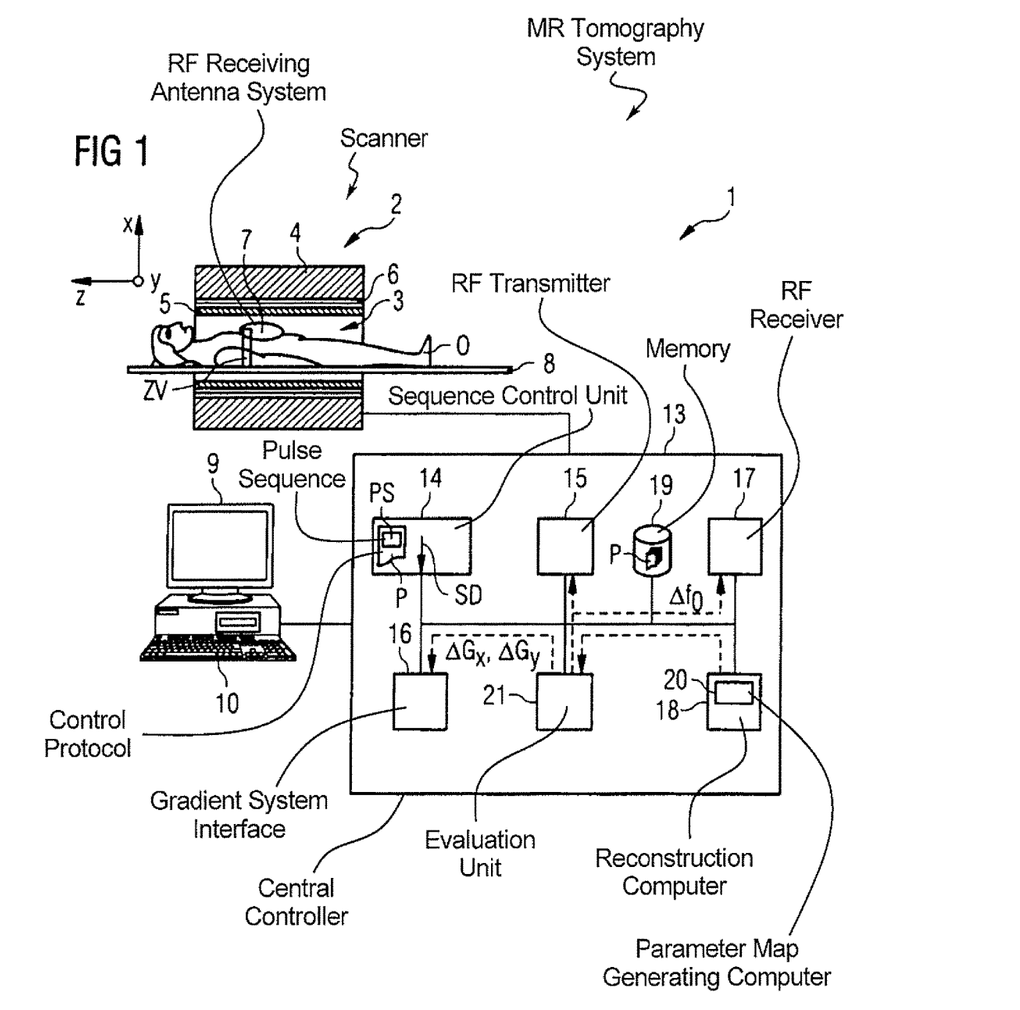
FIG. 1 schematically illustrates a magnetic resonance tomography system according to an exemplary embodiment of the invention.

FIG. 1 schematically shows an inventive magnetic resonance tomography system 1. The system 1 includes the actual magnetic resonance scanner 2 that has an examination space 3 or patient tunnel, into which, on a bed 8, an examination object O, or here a patient or examination person can be moved. The patient has the actual examination object, for example a specific organ, therein. A slice, as an example, is shown in the examination object O in FIG. 1 as a target volume ZV.

The magnetic resonance scanner 2 is conventionally fitted with a basic field magnet 4, a gradient system 6, and an RF transmitting antenna system 5 and an RF receiving antenna system 7. In the illustrated embodiment, the RF transmitting antenna system 5 is a body coil permanently fitted in the magnetic resonance scanner 2, whereas the RF receiving antenna system 7 includes local coils that are to be arranged on the patient or test person (symbolized in FIG. 1 only by one single local coil). Basically, however, the body coil can also be used as an RF receiving antenna system and the local coils as an RF transmitting antenna system, if these coils can each be switched over into different operating modes. The basic field magnetic system 4 is conventionally designed here such that it generates a basic magnetic field in the longitudinal direction of the patient, i.e. along the longitudinal axis of the magnetic resonance scanner 2 running in the z direction. The gradient system 6 conventionally has individually controllable gradient coils to be able to switch gradients in the x, y or z directions independently of each other. Furthermore, the magnetic resonance scanner 2 includes shim coils (not shown), which can be conventionally designed.

The MR system shown in FIG. 1 is a body system having a patient tunnel into which a patient can be completely introduced. The invention can be used, however, on other MR systems, for example with a laterally open, C-shaped housing, as well as with smaller magnetic resonance scanners, in which, for example, only one body part can be positioned.

The MR-system 1 also has a central controller 13 (computer) that controls the MR system 1. This central controller 13 has a sequence control unit 14 for measuring sequence control. With this the sequence of radio-frequency pulses (RF pulses) and gradient pulses is controlled as a function of a chosen pulse sequence PS or a sequence of multiple pulse sequences for acquiring data, within one measuring session, for multiple slices in a volume region of interest in the examination object. A pulse sequence PS of this kind can be predefined and parameterized within a measuring or control protocol P. Various control protocols P for different measurements or measuring sessions are conventionally stored in a memory 19 and can be selected by an operator (and if required, optionally changed) and then be used to carry out the measurement. In the present case the controller 13 contains, inter alia, pulse sequences that operate according to inventive method for the acquisition of the raw data for determination of the $B_0$ map. One example of a pulse sequence of this kind will be explained in more detail below with reference to FIG. 3.

For emitting the individual RF pulses of a pulse sequence PS, the central controller 13 has a radio-frequency transmitter 15 that generates, amplifies and feeds the RF pulses via a suitable interface (not shown in detail) into the RF transmitting antenna system 5. To control the gradient coils of the gradient system 6, in order to appropriately switch the gradient pulses in accordance with the predefined pulse sequence, the central controller 13 has a gradient system interface 16. The shim coils, for example, could also be activated by this gradient system interface 16, since the gradient coils are used anyway due to setting of the DC offset currents for shimming of the $B_0$ field (namely for compensating the linear portion of the field distortions). The sequence control unit 14 communicates in a suitable manner, for example by emitting sequence control data SD, with the radio-frequency transmitter 15 and gradient system interface 16 in order to execute the pulse sequences. The controller 13 also has a radio-frequency receiver 17 (likewise communicating in a suitable manner with the sequence control unit 14) to receive magnetic resonance signals within the read window, predefined by the pulse sequence PS, in a coordinated manner via the RF receiving antenna system 7. Within the context of the present invention, these are echo signals as explained below. The raw data for the individual slices are thus acquired.

A reconstruction computer 18 is provided with the acquired raw data and reconstructs magnetic resonance image data therefrom for the slices. Generally this reconstruction is done on the basis of parameters that are predefined in the respective measuring protocol. The image data then can be stored in a memory 19. In the present case the reconstruction computer 18 is designed to operate according to the inventive method, as will be explained below with reference to FIGS. 3 and 4. The phase difference maps used as the auxiliary parameter maps are also generated and compiled in this context, and this can occur in a specific parameter map generating computer component 20 of the reconstruction computer 18.

In an evaluation 21, the data are used to generate the desired $B_0$ map in the manner explained below and to ascertain the operating frequency $f_0$ and the shim parameters, in particular the gradient-adjustment data $\Delta G_x$, $\Delta G_y$, to be adjusted to compensate the linear portion of the $B_0$ field deviations for the subsequent measurement. These adjustment parameters can then be transferred to the corresponding components of the central controller 13, in other words the gradient-adjustment data $\Delta G_x$, $\Delta G_y$ to the gradient system interface 16 and the operating frequency $f_0$ to the radio-frequency transmitter 15 and the radio-frequency receiver 17.

The central controller 13 can be operated via a terminal having an input unit 10 and a display unit 9, via which the entire MR system 1 can be operated by an operator. MR images can also be displayed on the display unit 9 and measurements can be planned and started, and in particular control protocols P with suitable pulse sequences PS can be selected, as explained above, and optionally be modified by means of the input unit 10, optionally in combination with the display unit 9.

The inventive MR system 1 and in particular the controller 13 can have a large number of further components, not shown here but conventionally present on systems of this kind, such as a network interface, for example, to connect the entire system to a network and to be able to exchange raw data and/or image data or parameter maps, but also further data, such as patient-relevant data or control protocols by way of example.

Those skilled in the art know how, by radiating RF pulses and switching gradient pulses, suitable raw data can be acquired and MR images reconstructed therefrom, so this need not be explained herein in more detail. Double-echo gradient echo sequences are likewise known, with which the raw data for ascertaining a $B_0$ map according to the prior art can be acquired. Nevertheless, typical conventional double echo gradient echo sequence of this kind will first be explained below with reference to FIG. 2 to clarify the differences from the inventive multi-echo sequence that will then be explained in more detail with reference to the example illustrated in FIG. 3.

Figure 2:
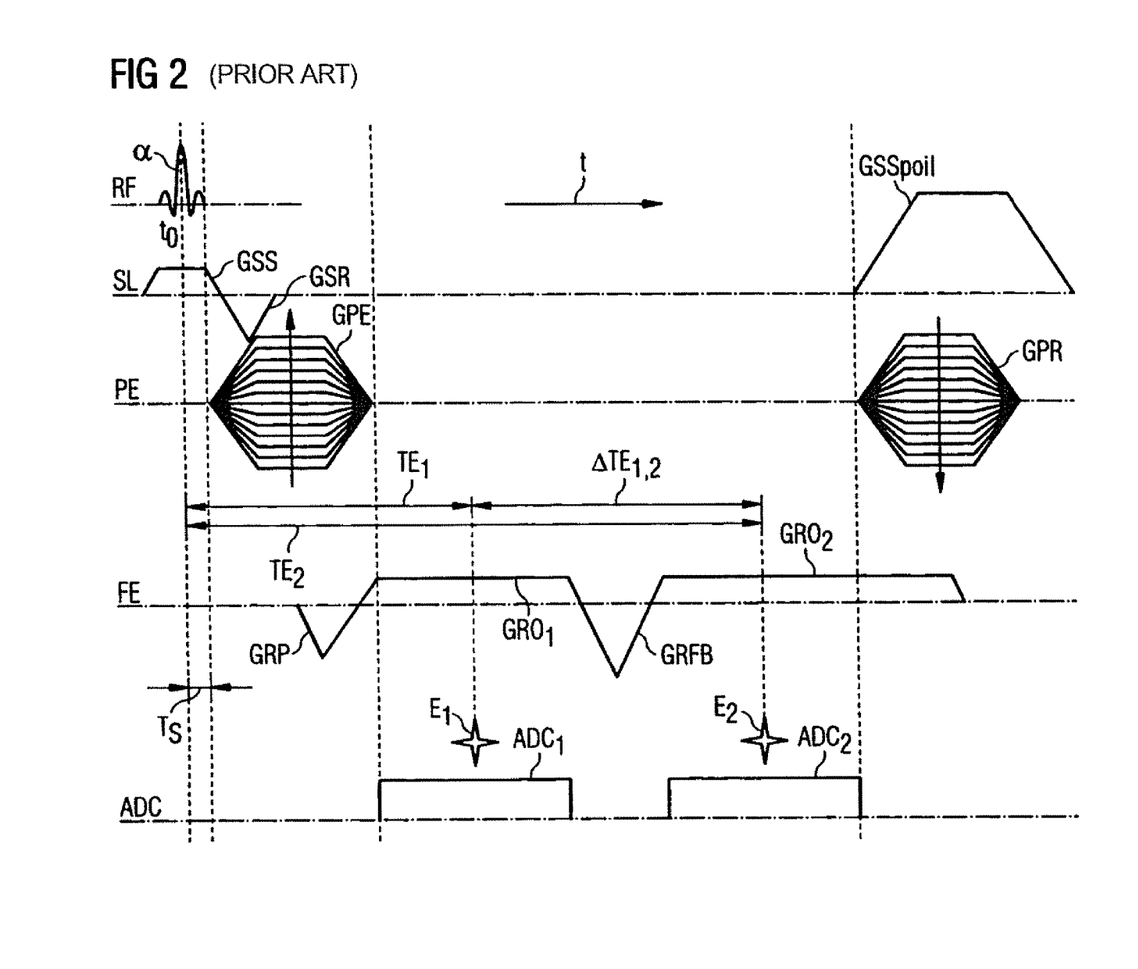
FIG. 2 shows a sequential plan for a possible sequence of a conventional double echo gradient echo sequence for determining a $B_0$ map according to the prior art.
Figure 3:
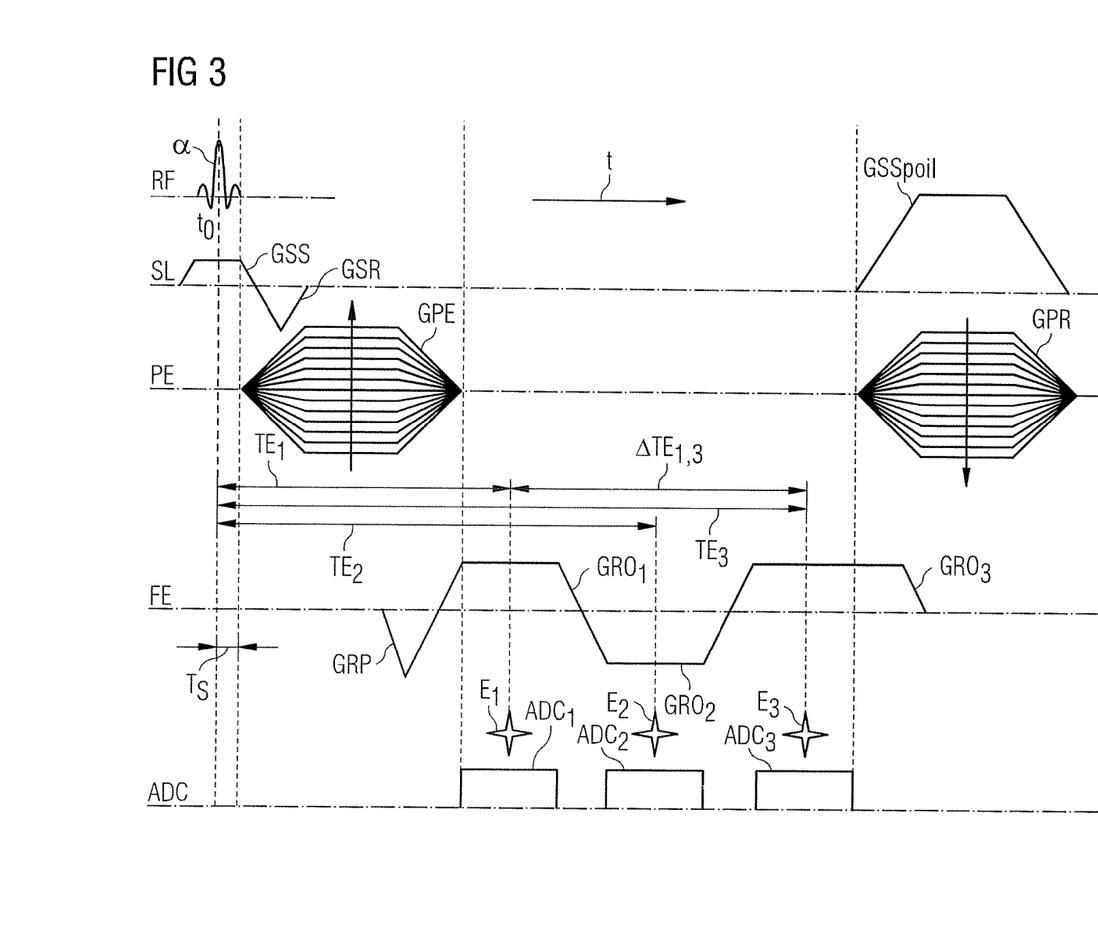
FIG. 3 shows an exemplary sequence of a multi-echo gradient echo sequence for determining a $B_0$ map according to an embodiment of the invention.

The sequence diagrams in FIGS. 2 and 3 each conventionally show on different axes the arrangement of the RF and gradient pulses, magnetic resonance signals (echo signals) and read window over time t (from left to right). The top axis RF shows the RF pulses and echo signals, the second axis SL the gradient pulses in the slice selection direction, the third axis PE the gradient pulses in the phase encoding direction, the fourth axis FE ("frequency encoding") the gradient pulses in the read direction and the bottom axis ADC the read window. The following applies to the three gradient axes SL, PE, FE: The horizontal axis shown in broken lines is the zero line in each case. The level of the signals in each case represents (not necessarily to scale) the relative amplitude. The sign of the amplitude (relative to the zero axis) corresponds to the direction of the gradient field.

FIG. 2 shows the sequence of a double echo gradient echo sequence, with which the data for a $B_0$ map can be acquired in one slice in the prior art. The principle mode of operation of a multi-echo gradient echo sequence is known to those skilled in the art.

The sequence starts here by way of example at time $t_0$ with a slice-selective RF slice excitation pulse α (hereinafter called "excitation pulse" for short), with simultaneous application of a slice selection gradient pulse GSS. At the end of the excitation pulse α (after the period $T_S$ to $t_0$) a rephasing-gradient pulse GSR is switched in the slice selection direction SL and a phase encoding gradient pulse GPE is switched in the phase encoding direction GE. A phasing gradient pulse GRP and subsequently two read gradient pulses $GRO_1$, $GRO_2$ with an interposed, so-called "Fly-Back" gradient pulse GRFB are switched in the frequency encoding direction FE to ensure that before the second read gradient pulse $GRO_2$ the spins are in the same state as before the first read gradient pulse $GRO_1$. Echo signals occur in each case toward the center of the two read gradient pulses $GRO_1$, $GRO_2$ and the "Fly-Back" gradient pulse GRFB, with only the two echo signals $E_1$, $E_2$, which occur at the read gradient pulses $GRO_1$, $GRO_2$ at the echo times $TE_1$, $TE_2$, being read or raw data being acquired (therefore it is also only these echo signals $E_1$, $E_2$ that are symbolized in FIG. 2). Reading of the echo signals $E_1$, $E_2$ is in each case shown by a read window $ADC_1$, $ADC_2$ (read interval). The sequence ends with the switching of a rephasing gradient pulse GPR in the phase encoding direction PE and a spoiler gradient pulse GSSpoil in the slice selection direction SL. The functions of the individual gradient pulses are known to those skilled in the art and therefore do not need to be explained in detail. This sequence is repeated several times for each slice, with the phase encoding gradient pulse GPE and the rephasing gradient pulse GPR each changing in the phase encoding direction GE to fill k-space for this slice.

The raw data from the echo signals $E_1$, $E_2$ can—while maintaining specific echo times $TE_1$, $TE_2$—then be used as follows for ascertaining a relative $B_0$ map:

In gradient echo imaging a deviation from the resonance frequency results in the spins acquiring an additional phase $\Delta \Phi_i(x,y,z)$ there which increases linearly with time. For the echo time $TE_i$ this additional phase is:

$$\Delta \Phi_i(x,y,z) = 2\pi \cdot \Delta f(x,y,z) \cdot TE_i. \qquad (2)$$

Therein Δf(x,y,z) denotes the local deviation of the resonance frequency actually given at a location (x,y,z) from the (intended) resonance frequency which is connected to the local deviation from the (intended) homogeneous $B_0$ field by $$\Delta f(x,y,z)=(\gamma/(2\pi))\cdot \Delta B_0(x,y,z) \quad (3)$$

Therein $\gamma/(2\pi)$ is the gyromagnetic ratio which for protons is 42.576 MHz/T.

The local deviation Δf(x,y,z) of the resonance frequency from the system frequency (or the local deviation of the $B_0$ field) can therefore be extracted from the phase change $\Delta\Phi_{1,2}(x,y,z)$ of the signal between the two echoes:

$$\Delta f_{B0}=\Delta\Phi_{1,2}/(2\pi\cdot(TE_2-TE_1))=\Delta\Phi_{1,2}/(2\pi\cdot\Delta TE_{2,1}) \quad (4)$$

If $I_1(x,y,z)$ is the complex image calculated from the data of the first echo signal $E_1$ and $I_2(x,y,z)$ is the complex image calculated from the data of the second echo signal $E_2$, the phase change $\Delta\Phi_{1,2}$ between the echoes at location (x,y,z) for example may be calculated in that the image points at location (x,y) are conjugated, multiplied by each other in a complex manner and then the phase is extracted with the aid of the arc tan 2 function:

$$\Delta\Phi_{21} = \arctan\left(\frac{\text{Im}\{I_2(x,y,z)I_1^*(x,y,z)\}}{\text{Re}\{I_2(x,y,z)I_1^*(x,y,z)\}}\right) \quad (5)$$

$$= \text{atan2}(\text{Im}\{I_2(x,y,z)I_1^*(x,y,z)\}, \text{Re}\{I_2(x,y,z)I_1^*(x,y,z)\})$$

The a tan 2 function is provided by most programming languages. It expands the value range of the arc tan operation from (-π/2, π/2) to [-π,+π].

Human tissue generally contains protons that are bound to water and those that are bound to fat. The resonance frequencies of protons bound to water and fat differ by the amount:

$$\Delta f_{chem}=(\gamma/(2\pi))\cdot B_0\cdot\Delta\delta\cdot 10^{-6} \quad (6)$$

Here $\gamma/(2\pi)$ is again the gyromagnetic ratio and Δδ the chemical shift which is approximately −3.3, . . . , 3.4 ppm. $B_0$ is the field strength. The frequency difference is accordingly about −204 Hz at 1.5 T and about −408 Hz at 3 T.

Accordingly the situation should expediently be prevented where a measured phase difference is incorrectly interpreted as a local $B_0$ inhomogeneity as a consequence of the chemical shift. This may be achieved by the echo time difference $\Delta TE_{2,1}$ (see equation (4)) being chosen such that the phase, which protons bound to water additionally accumulate, compared to protons bound to fat, between the two echo signals $E_1$, $E_2$ as a consequence of the chemical shift, is exactly one integral multiple of 2π, i.e. the following applies:

$$\Delta TE_{2,1}=TE_2-TE_1=1/\Delta f_{chem} \quad (7)$$

With a field strength of 1.5 T this corresponds to an echo time difference of $\Delta TE_{2,1}$=4.60 ms. With a field strength of 3 T the echo time difference $\Delta TE_{2,1}$ is halved to 2.30 ms (or an integral multiple thereof).

The drawback of this approach is that, due to the periodicity of the arc tan 2 function, with this choice of echo time differences, the frequency value range, within which the frequency deviations can clearly be identified or resolved (hereinafter therefore called the "frequency resolution" for short), is also limited to the range $[-\Delta f_{chem}/2, +\Delta f_{chem}/2]$. With a 1.5 T device this frequency value range is therefore approx. ±102 Hz, with a 3 T device approx. ±204 Hz. In clinical MR devices the typical deviation of the resonance frequency from the system frequency in the measuring volume is in the order of magnitude of ±500 Hz, however. For this reason inter alia currently the phase map is used in practice only for determining the shim terms, and the local resonance frequency is determined in a separate adjustment, what is known as the frequency adjustment, with a spectroscopic method.

As will be shown below, with the use of the invention it is possible to determine the absolute deviation of the local resonance frequency from the system frequency in a frequency value range which is a multiple of the conventional method. The absolute resonance frequency therefore can be directly determined in a location-specific manner from the $B_0$ map, and a separate frequency adjustment is no longer required.

FIG. 3 shows in this regard a sequential plan for a modified sequence that can be used for the acquisition of data for the inventive method. It differs from the sequence shown in FIG. 2 essentially in that a further read gradient pulse is switched between the first and the last read gradient pulses instead of a "Fly-Back" gradient pulse. At all three read gradient pulses $GRO_1$, $GRO_2$, $GRO_3$ echo signals $E_1$, $E_2$, $E_3$ occur in each case (at the echo times $TE_1$, $TE_2$, $TE_3$) that are each read (i.e. MR signals/data are acquired therefrom), and this is illustrated by three read windows $ADC_1$, $ADC_2$, $ADC_3$.

A sequence of this kind with three echo signals $E_1$, $E_2$, $E_3$ is a very simple exemplary embodiment. As will be explained below, sequences with more than three echo signals can and are preferably also used within the context of the invention.

The echo time difference between the first echo signal with index 1 and the last echo signal with the index NE (in FIG. 3 NE=3) is again chosen such that the phase difference of protons bound to water and protons bound to fat as a consequence of the chemical shift is an integral multiple of 2π:

$$\Delta TE_{NE,1}=TE_{NE}-TE_1=1/\Delta f_{chem} \quad (7a)$$

For the sequence in FIG. 3 $\Delta TE_{NE,1}=\Delta TE_{3,1}$ therefore. For the sequence in FIG. 2 $\Delta TE_{NE,1}=\Delta TE_{2,1}$, i.e. equation (7a) is a generalization of equation (7).

As FIG. 3 shows, according to the invention, at least one further echo signal is formed and read (in FIG. 3 the echo signal $E_2$ now therefore) between the first and the last echo signals, however.

As in the prior art, a first phase map may in turn also be calculated here from the phase difference of the first and last echo signals $E_1$, $E_3$:

$$\Delta\Phi_{LR}(x,y,z)=a\tan 2(\text{Im}\{I_{NE}(x,y,z)I^*_1(x,y,z)\},\text{Re}\{I_{NE}(x,y,z)I^*_1(x,y,z)\}) \quad (8)$$

In this first phase map $\Delta\Phi_{LR}(x,y,z)$ the phase of each pixel is in turn solely a function of the local deviation of the resonance frequency from the system frequency, and the resolvable frequency value range is limited to $[-\Delta f_{chem}/2, +\Delta f_{chem}/2]$. The index "LR" stands here for "low resolution" and implies the spectrally low resolution, i.e. the limited resolvable frequency value range of the first phase map.

With the use of the intermediate echo (in FIG. 3 the second echo signal $E_2$) a second phase map $\Delta\Phi_{HR}(x,y,z)$ with a greater resolvable frequency value range may be calculated as follows:

$$\Delta\Phi_{HR}(x, y, z) = \sum_{i=2}^{NE} \text{atan2}(\text{Im}\{I_i(x, y, z)I_{i-1}^*(x, y, z)\}, \text{Re}\{I_1(x, y, z)I_{i-1}^*(x, y, z)\}) \quad (9)$$

In other words, the phase difference between respectively successive echo signals are extracted for the second phase map $\Delta\Phi_{HR}(x,y,z)$ and these phase differences are added up. The resolvable frequency value range (i.e. the spectral resolution) of this second phase map $\Delta\Phi_{HR}(x,y,z)$ is increased compared to the first phase map $\Delta\Phi_{LR}(x,y,z)$ by a factor NE−1, for which reason the index "HR" (for "high resolution") was chosen here. The number NE of echoes is in practice chosen to be so large that it may be assumed that the phase evolution between two successive echoes is smaller than ±π, in other words, that there are no wrapping artifacts. Sequences with five echo signals are preferably used in the case of 3 T body systems. With a frequency range of ±4·204 Hz=±816 Hz phase wraps themselves are therefore reliably avoided in the especially critical region of the neck, without restricting the typical spatial resolution of the parameter map. With 1.5 T systems even more echo signals could be acquired owing to the greater echo spacing. However, this is not necessary since the field variations at the low field strength are smaller as a rule anyway.

The fat signal and the water signal are not aliased in this second phase map $\Delta\Phi_{HR}(x,y,z)$, however. Since the chemical composition of the examination tissue is generally not known, it is a priori consequently not known which portion of the phase evolution is a consequence of the sought local $B_0$ inhomogeneity and which portion a consequence of the chemical shift. Since the sum of the phase evolution between the individual echo signals is equal to the phase evolution between the first and last echoes the following applies:

$$\Delta\Phi_{h2o,HR}(x,y,z)=\Delta\Phi_{LR}(x,y,z)\pm n(x,y,z)\cdot 2\pi \quad (10)$$

where n(x,y,z) integral $$\Delta\Phi_{h2o,HR}(x,y,z)=\Delta\Phi_{HR}(x,y,z)+c(x,y,z)\cdot 2\pi \quad (11)$$

where $0 \leq c(x,y,z) \leq 1$

Therein $\Delta\Phi_{h2o,HR}(x,y,z)$ is the sought phase map with the high resolvable frequency value range which only contains the phase evolution as a consequence of the local $B_0$-inhomogeneity. The index h2o was chosen here since usually the phase map $\Delta\Phi_{h2o,HR}(x,y,z)$ is for protons bound to water. The integer n(x,y,z) in equation (10) indicates how often the signal of the first phase map $\Delta\Phi_{LR}(x,y,z)$ with the low resolvable frequency value range is aliased. The factor c(x,y,z) in equation (11) depends on the chemical composition of the pixel. If a pixel by way of example at location $(x_0,y_0,z_0)$ contains only protons bound to water, then $c(x_0,y_0,z_0)=0$; if it contains only protons bound to fat, then $c(x_0,y_0,z_0)=1$, since the echo time difference between the first and the last echo signals was chosen precisely such that the phase evolution as a consequence of the chemical shift is equal to 2π. Both (parameter-)maps n(x,y,z) and c(x,y,z) are initially unknown.

As will be shown below, it is possible to ascertain, from the second phase map, $\Delta\Phi_{HR}(x,y,z)$ with the greater resolvable frequency value range, but in which a phase evolution as a consequence of the chemical shift leads to falsifications, and the first phase map $\Delta\Phi_{LR}(x,y,z)$ with a smaller resolvable frequency value range, but with a fat-water alias, the phase map $\Delta\Phi_{h2o}$ with higher resolvable frequency value range in which a phase evolution as a consequence of the chemical shift is no longer relevant. According to equations (10) and (11) it is sufficient to determine either the map n(x,y,z) or the map c(x,y,z).

Figure 4:
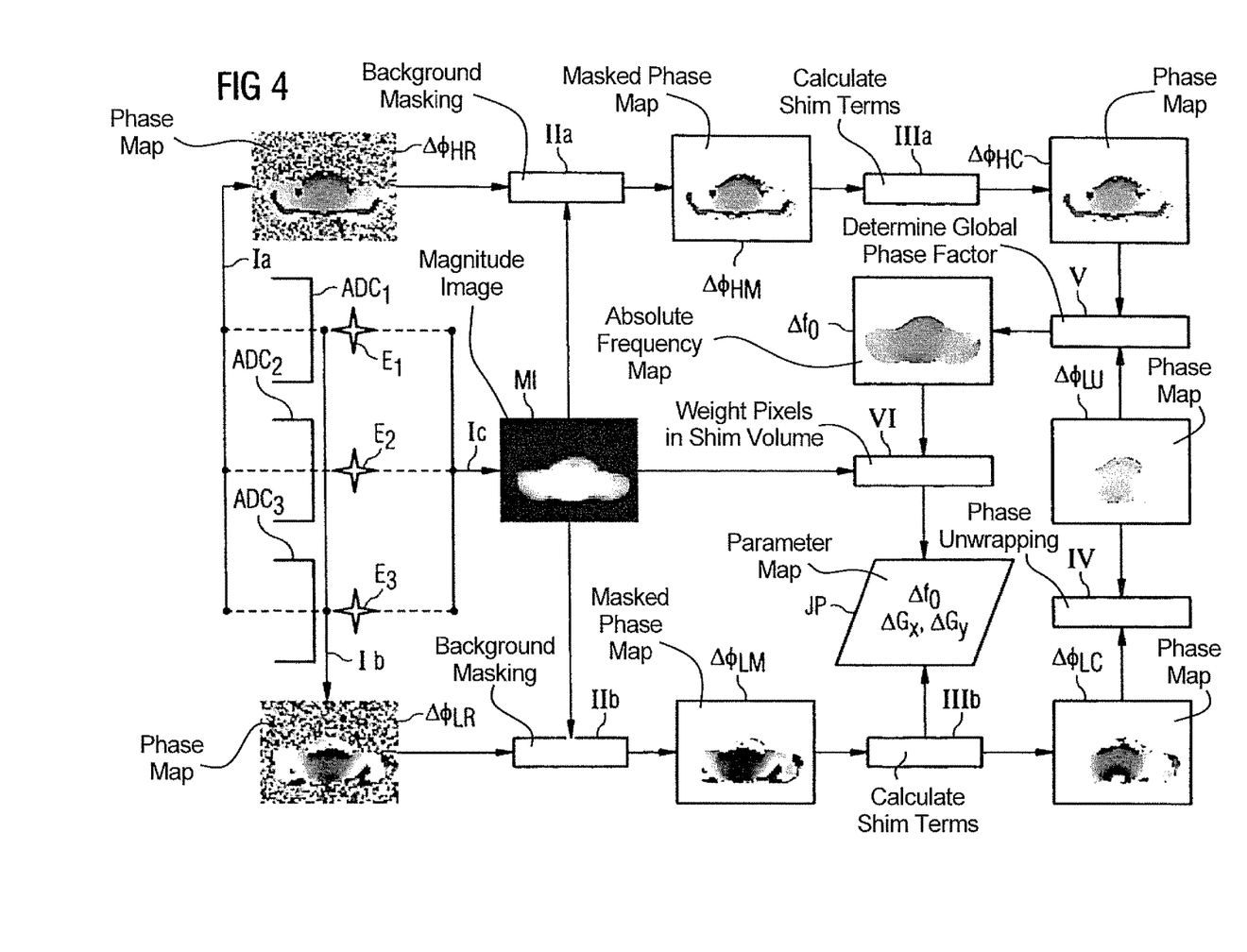
FIG. 4 is a flowchart of an exemplary sequence of an inventive method for determining a $B_0$ map from the raw data acquired with a sequential plan according to FIG. 3.

FIG. 4 shows a flowchart of an exemplary embodiment of the invention.

As already described, first two phase maps are calculated here as auxiliary parameter maps. In step Ia a first phase map $\Delta\Phi_{LR}(x,y,z)$ with a smaller resolvable frequency value range is calculated from the raw data of the first and of the last echo signal $E_1$, $E_3$ with the aid of equation (8) and in step Ib and a second phase map $\Delta\Phi_{HR}(x,y,z)$ with a greater resolvable frequency value range is calculated from the raw data of all echo signals $E_1$, $E_2$, $E_3$ with the use of equation (9). FIG. 4 shows as an example the phase maps $\Delta\Phi_{LR}(x,y,z)$, $\Delta\Phi_{HR}(x,y,z)$ from a slice in the region of the shoulder perpendicular to the longitudinal axis of the body of a patient/test person.

Furthermore, in steps Ic a magnitude image MI(x,y,z) is calculated from this slice, whose values each indicate the image intensity or amplitude at location (x,y,z). To maximize the signal-to-noise ratio this magnitude image MI is preferably calculated from the raw data of all echo signals $E_1$, $E_2$, $E_3$, for example as follows as the sum of the squares:

$$MI(x, y, z) = \frac{1}{NE}\sqrt{\sum_{i=1}^{NE} I_i(x, y, z)I_i^*(x, y, z)} = \frac{1}{NE}\sqrt{\sum_{i=1}^{NE} |I_i(x, y, z)|^2} \quad (12)$$

This magnitude image can advantageously be used in a number of process steps.

This image may be used, for example, in the following process steps IIa, IIb for background masking or background segmenting of the first phase map $\Delta\Phi_{LR}(x,y,z)$ and of the second phase map $\Delta\Phi_{HR}(x,y,z)$. "Background" denotes pixels which substantially only contain noise and which would thus only make the subsequent process steps more laborious. The object of background masking is to identify pixels of this kind and in a further map, what is known as a background mask N(x,y,z), to give them the pixel value 0 for example, while all remaining pixels in this background mask are given for example the pixel value 1 (the background mask is not explicitly shown in FIG. 4). Pixels with the mask value 0 are then excluded from subsequent process steps. A simple threshold value method has proven to be sufficient for calculating the background mask in a first prototype of the invention. Pixels whose value is less than a specific threshold value S denote the background:

$$N(x, y, z) = \begin{cases} 0 & M(x, y, z) < S \\ 1 & M(x, y, z) \geq S \end{cases} \quad (13)$$

The threshold value S itself was likewise determined from the magnitude image. For this purpose an image segment with a minimal mean signal for example can firstly be sought in the magnitude image MI. The standard deviation in this image segment can also be calculated. The threshold value S can then be set equal to a multiple (factor 2 to 10) of the mean signal+the standard deviation.

The background mask itself is not shown in FIG. 4, although the masked image regions in the masked first phase map $\Delta\Phi_{LM}(x,y,z)$ and the masked second phase map $\Delta\Phi_{HM}(x,y,z)$ can clearly be seen as background areas.

After background masking, the shim terms can optionally be calculated from the masked first phase map $\Delta\Phi_{LM}(x,y,z)$ and/or the masked second phase map $\Delta\Phi_{HM}(x,y,z)$. Differential methods are known in the prior art which allow this despite a phase alias. Since the shim terms also affect the $B_0$ field in the target volume during the subsequent measurement, their phase contribution must be compensated. The phase contribution of the shim terms can for example be subtracted from the two maps $\Delta\Phi_{LM}(x,y,z)$, $\Delta\Phi_{HM}(x,y,z)$. The shim terms are preferably determined in only one of the two maps $\Delta\Phi_{LM}(x,y,z)$, $\Delta\Phi_{HM}(x,y,z)$ to avoid a deviation of the two maps after compensation as a consequence of slightly different results.

In the embodiment of FIG. 3, only the linear shim terms $\Delta G_x$, $\Delta G_y$ (DC offset currents) are calculated on the basis of the masked first phase map $\Delta\Phi_{LM}(x,y,z)$ and compensated in the two maps $\Delta\Phi_{LM}(x,y,z)$, $\Delta\Phi_{HM}(x,y,z)$ (steps IIIa and IIIb). This is sufficient for example in the case of slice-specific shimming since in most currently used clinical devices only the linear terms can be switched sufficiently quickly for layer-specific shimming anyway. Technically it would also be easily possible, however, to determine shim terms of a higher order.

As a result of this compensation, linearly phase-corrected and masked phase maps $\Delta\Phi_{LC}(x,y,z)$, $\Delta\Phi_{HC}(x,y,z)$ then exist in each case, and these are then used in the subsequent steps. The phase correction has the advantage in particular for the first phase map $\Delta\Phi_{LC}(x,y,z)$ that it is "smoother" and therefore the subsequently explained unwrapping of the map is more straightforward.

In the next process step IV the first phase map $\Delta\Phi_{LC}(x,y,z)$ is unwrapped ("phase unwrapping"). As mentioned in the introduction, this measured (masked and corrected) first phase map $\Delta\Phi_{LC}(x,y,z)$ generally exhibits artificial sudden phase jumps (wrappings), that cause lies due to the fact that the measured phase can only assume values in the range $\pm\pi$ while the genuine sought phase has a greater value range (see equation (10)). "Phase unwrapping" means techniques that allow the original smooth phase from the measured phase map to be restored except for an unknown global offset value, according to:

$$\Delta\Phi_{h2o,HR}(x,y,z)=\Delta\Phi_{LU}(x,y,z)\pm n\cdot 2\pi \qquad (14)$$

Therein $\Delta\Phi_{h2o,HR}(x,y,z)$ is again the actually sought phase map, $\Delta\Phi_{LU}(x,y,z)$ the first phase map (with the more limited resolvable frequency value range) after the "phase unwrapping" (the index U stands for "unwrapped" here) and $\delta_0 = n\cdot 2\pi$ said global offset value. n is an integral global offset factor. A phase deviation of $\delta_0 = 2\pi$ corresponds to a frequency offset of $\Delta f_{chem}$, i.e. about 204 Hz at 1.5 T and 408 Hz at 3 T. In this context "global" means that the offset value $\delta_0$ or offset factor n is independent of the location (x,y,z). The difference from equation (10) therefore lies in that the offset from the sought phase map no longer depends on the pixel position.

With the availability of powerful computers in particular, a series of algorithms has been developed which reliably solve the problem of "phase unwrapping" and can be used in this process step IV. One example of a suitable algorithm is described, for example, in the article mentioned above by H. Abdul-Rahman et al.

To be able to determine the absolute deviation of the local resonance frequency from the system frequency for the desired $B_0$ map directly from the phase map, this global offset value $\delta_0 = n\cdot 2\pi$ or offset factor n can be determined as described below.

In the next process step V, the still unknown global phase factor n is determined for this purpose in equation (14) with the aid of the second phase map $\Delta\Phi_{HM}(x,y,z)$, which covers the broader frequency value range, and equations (11) and (14)

If the still unknown sought phase map $\Delta\Phi_{h2o,HR}(x,y,z)$ is eliminated from equations (11) and (14), then it follows therefrom that:

$$\Delta\Phi_{LU}(x,y,z)\pm n\cdot 2\pi = \Delta\Phi_{HR}(x,y,z)+c(x,y,z)\cdot 2\pi \qquad (15)$$

where $0 \leq c(x,y,z) \leq 1$

The sought offset factor n can accordingly be clearly determined for any pixel at location $(x_0,y_0,z_0)$ in the target volume by choosing a factor $n_0$ for this point in such a way that:

$$\Delta\Phi_{HR}(x_0,y_0,z_0) \leq \Delta\Phi_{LU}(x_0,y_0,z_0) \pm n_0\cdot 2\pi \leq \Delta\Phi_{HR}(x_0,y_0,z_0)+2\pi \qquad (16)$$

In other words, $n_0$ is chosen such that the unwrapped first phase map $\Delta\Phi_{LU}(x,y,z)$ (with the smaller frequency value range), after addition of the terms $n_0\cdot 2\pi$ for the relevant pixels at location $(x_0,y_0,z_0)$, is greater than or equal to the second phase map $\Delta\Phi_{HC}(x,y,z)$ (with the larger frequency value range), but exceeds this by a maximum of $2\pi$. For each pixel there is exactly one factor $n_0$ for which this condition (16) is met. Equality on the left side should occur if the chosen pixel is dominated by free water. If, however, a pixel was randomly chosen that is dominated by fat, equality on the right side of equation (16) is to be expected. For mixed pixels, which contain significant portions of both water and fat, a "genuinely smaller than" is to be expected on two sides.

In principle, the sought global offset factor n could simply be set so as to be equal to this offset factor $n_0$ found at location $(x_0,y_0,z_0)$ since this value is independent of location. Since, however, the determination of the global offset factor n using a single pixel would be prone to error owing to the unavoidable noise burden of the measured data in cases in which the (for example randomly) chosen pixel is dominated by fat or water, a plurality of "candidate offset factors" $n_0$ is preferably independently determined for a number of pixels. The offset factor n can then be suitably chosen on the basis of the candidate offset factors $n_0$. If the results for the candidate offset factors $n_0$ are very different at different pixels, the candidate offset factor $n_0$ which is found most often statistically can therefore be chosen as the global offset factor n, for example.

The global offset value $\delta_0 = n\cdot 2\pi$ found as described above is then added or subtracted for example in step V to/from the unwrapped phase map $\Delta\Phi_{LU}(x,y,z)$. According to equation (14) this supplies the absolute phase map $\Delta\Phi_{h2o,HR}(x,y,z)$. After pixel-wise multiplication by known conversion factors (cf. equations (2) and (3) in this regard) an absolute frequency map can be calculated therefrom as an adjustment parameter map JP $$\Delta f_0(x,y,z) = \frac{1}{2\pi\Delta TE}(\Delta\varphi_{LU}(x,y,z) \pm n\cdot 2\pi) \qquad (17)$$

or an absolute $B_0$ map $$\Delta B_0(x,y,z) = \frac{2\pi}{\gamma}\Delta f_0(x,y,z) = \frac{2\pi}{\gamma}\frac{1}{2\pi\Delta TE}(\Delta_{LU}(x,y,z) \pm n\cdot 2\pi) \qquad (18)$$

Here the absolute frequency map $\Delta f_0(x,y,z)$ indicates the sought deviation of the local resonance frequency from the RF center frequency or system frequency which was adjusted during the measurement of the phase maps $\Delta\Phi_{LR}$ (x,y,z), $\Delta\Phi_{HR}$(x,y,z). The absolute $B_0$ map indicates the corresponding local $B_0$ field deviation from the $B_0$ field, which corresponds to the adjusted RF center frequency or system frequency. Generally the absolute frequency map or the $B_0$ map are more highly spatially resolved than required. With slice-specific shimming, only one frequency per slice for example is required. This can be ascertained by fixing a shim volume for each slice for example and determining the frequency for this slice as a weighted mean frequency in the shim volume. The magnitude image MI from equation (12) can be used, for example, for weighting the individual pixels in the shim volume. This is the case in step VI of FIG. 4.

By determining the absolute resonance frequency directly from the $B_0$ map a separate frequency adjustment measurement can be dispensed with, as mentioned above. The duration of the examination is reduced therefore, and this reduces the exposure for the patient and the costs. This is advantageous in particular with slice-specific shimming and adjustment of the RF center frequency, since otherwise one frequency adjustment measurement per slice would be required.

An unwrapped, standardized $B_0$ map can, moreover, advantageously be used in many other magnetic resonance methods. Examples are an EPI distortion correction and Dixon method for fat-water separation.

The inventive approach does not extend the acquisition length of the $B_0$ map compared with the prior art. Since, as a rule, $B_0$ maps with only comparatively low spatial resolution are required, the acquired intermediate echoes and the additional phase map with a large resolvable frequency value range provide additional knowledge without extra costs.

In conclusion, is again noted that the above-described detailed methods and structures are exemplary embodiments and that the basic principle may also be varied within wide ranges by those skilled in the art without departing from the scope of the invention.

Therefore, instead of in step IIIb, the shim currents can, by way of example in the embodiment according to FIG. 4, alternatively also be determined together with the new RF center frequency $\Delta f_0$ at the end on the basis of the calculated absolute phase map $\Delta\Phi_{h20,HR}$(x,y,z) or the absolute $B_0$ map determined therefrom. The field contribution $\Delta B_j$(x,y,z) of the $j^{th}$ shim channel at location (x,y,z) is namely proportional to the shim current $I_j$:

$$\Delta B_j(x,y,z) = C_j(x,y,z) \cdot P_j \cdot I_j \quad (19)$$

In equation (19) $C_j$(x,y,z) is the known, standardized field distribution of the shim channel j and $P_j$ the likewise known location-independent sensitivity of the shim channel j. The index j can assume values of 1, . . . , N, where N is the number of available shim channels. The currents $\Delta I_j$ and the new RF center frequency $\Delta f_0$ can then be optimally chosen in such a way that they optimally compensate the measured local $\Delta B_0$(x,y,z) field deviations in the target volume:

$$-\Delta B_o(x, y, z) = \frac{2\pi}{\gamma}\Delta f_0 + \sum_{j=1}^{N} \Delta B_j(x, y, z) = \frac{2\pi}{\gamma}\Delta f_0 + \sum_{j=1}^{N} C_j(x, y, z) \cdot P_j \cdot \Delta I_j \quad (20)$$

In the equation system (20) $\Delta B_0$(x,y,z) is the absolute $B_0$ map from equation (18). The sought unknowns in this equation system are $\Delta f_0$, the change in the system frequency compared to the adjustment during the acquisition of the parameter map, and the N values $\Delta I_j$, which indicate the changes in the current in the $j^{th}$ shim channel compared with the adjustment during the acquisition of the parameter map. The mathematical term (20) therefore provides an equation for each pixel in the shim volume. Since the number of pixels in the shim volume is usually significantly greater than the number (N+1) of unknowns in the equation system (20), this is an overdetermined equation system which can be solved in terms of the smallest quadratic deviation using standard methods. The differential shim methods cited above in connection with step IIIb do not have to be used in this alternative.

Although modifications and changes may be suggested by those skilled in the art, it is the intention of the inventor to embody within the patent warranted hereon all changes and modifications as reasonably and properly come within the scope of his contribution to the art.

I claim as my invention:
1. A method for generating a diagnostic image of a target volume of an examination subject, comprising:
   operating a magnetic resonance scanner, while the examination subject is situated therein, in order to execute an MR data acquisition sequence in a preliminary scan of the examination subject so as to excite nuclear spins of selected tissue in a spatial region of the examination subject, which comprises said target volume, to cause the excited nuclear spins to emit echo signals;
   operating said magnetic resonance scanner to activate gradient fields to read out raw data from at least three echo signals, with a relative timing of the activation of said gradient fields being selected to produce a first echo time difference between two of said at least three echo signals that causes phase evolutions of signals of a second spectral component of said selected tissue to differ, during said first echo time difference, from phase evolutions of signals from a first spectral component of said selected tissue, substantially by $2\pi$, and with an echo time of at least a further one of said at least three echo signals selected to be between respective echo times of said two of said at least three echo signals that have said first echo time difference;
   providing said raw data to a computer and, in said computer, generating a parameter map from said raw data of said at least three echo signals;
   making said parameter map available at an output of said computer in electronic form;
   using said parameter map in said computer to modify said MR data acquisition sequence with a modification selected from the group consisting of shimming a basic magnetic field of the magnetic resonance scanner, and determining a current operating frequency of the magnetic resonance scanner, thereby producing an adjusted MR data acquisition sequence;
   in said computer, generating electronic control signals corresponding to said adjusted MR data acquisition sequence and providing said control signals to said magnetic resonance scanner with the examination subject situated therein in order to operate the magnetic resonance scanner so as to acquire diagnostic magnetic resonance data from said target volume with said adjusted MR data acquisition sequence; and
   in said computer, reconstructing a diagnostic magnetic resonance image of the target volume from the acquired diagnostic magnetic resonance data, and making the reconstructed diagnostic magnetic resonance image available from the computer in electronic form.

2. A method as claimed in claim 1 comprising, also in said computer, generating a first auxiliary parameter map from raw data of said two echo signals having said first echo time difference.

3. A method as claimed in claim 2 comprising, also in said computer, generating a second auxiliary parameter map from raw data of said at least three echo signals.

4. A method as claimed in claim 3 wherein each of said first auxiliary parameter map and said second auxiliary parameter map has a phase value range and a frequency value range, and generating said second auxiliary parameter map to have a higher phase value range or a higher frequency value range than said first auxiliary parameter map.

5. A method as claimed in claim 3 comprising generating said first auxiliary parameter map to be phase-unwrapped, and generating said parameter map in said computer from the phase-unwrapped first auxiliary parameter map and said second auxiliary parameter map.

6. A method as claimed in claim 5 comprising generating said parameter map from said phase-unwrapped first auxiliary parameter map by ascertaining a global offset value from a plurality of candidate offset values respectively for a plurality of map points in said parameter map, using said second auxiliary parameter map.

7. A method as claimed in claim 6, wherein
if said second spectral component has a lower resonance frequency than said first spectral component, determining a candidate offset value for a respective map point of said parameter map to cause a value of the phase-unwrapped first auxiliary parameter map at said map point, after addition of said candidate offset value, not to be below a value of said second auxiliary parameter map at said map point and to exceed, at a maximum, a value that matches the phase $2\pi$, with said candidate offset value matching an integral multiple of the phase $2\pi$; and
if said second spectral component has a higher resonance frequency than said first spectral component, determining a candidate offset value for a respective map point of said parameter map to cause a value of the phase-unwrapped first auxiliary parameter map at said map point, after addition of said candidate offset value, not to exceed a value of said second auxiliary parameter map at said map point and to fall below, at a maximum, a value that matches the phase $2\pi$, with said candidate offset value matching an integral multiple of the phase $2\pi$.

8. A method as claimed in claim 3 comprising masking at least one of said first auxiliary parameter map and said second auxiliary parameter map in a region outside of a region of interest of said target volume.

9. A method as claimed in claim 8 comprising implementing said masking using magnitude image data of said target volume generated from said raw data of said at least three echo signals.

10. A method as claimed in claim 3 comprising phase-unwrapping said first auxiliary parameter map and, before phase-unwrapping said first auxiliary parameter map, subjecting said first auxiliary parameter map to a linear phase correction.

11. A method as claimed in claim 3 comprising subjecting said second auxiliary parameter map to a linear phase correction.

12. A method as claimed in claim 1 wherein said modification is determining said current operating frequency, and comprising determining said current operating frequency for a shim volume comprising at least said target volume, from a weighted average parameter of said parameter map in said shim volume.

13. A magnetic resonance apparatus for generating a parameter map for a target volume in an examination subject, said parameter map representing a field deviation from the resonance frequency of a first spectral component of selected tissue in the examination subject, comprising:
a magnetic resonance scanner;
a control computer configured to operate said magnetic resonance scanner, while the examination subject is situated therein, in order to execute an MR data acquisition sequence in a preliminary scan of the examination subject so as to excite nuclear spins of said selected tissue in a spatial region of the examination subject, which comprises said target volume, to cause the excited nuclear spins to emit echo signals;
said control computer being configured to operate said magnetic resonance scanner to activate gradient fields to read out raw data from at least three echo signals, with a relative timing of the activation of said gradient fields being selected to produce a first echo time difference between two of said at least three echo signals that causes phase evolutions of signals of a second spectral component of said selected tissue to differ, during said first echo time difference, from phase evolutions of signals from said first spectral component of said selected tissue, substantially by $2\pi$, and with an echo time of at least a further one of said at least three echo signals selected to be between respective echo times of said two of said at least three echo signals that have said first echo time difference;
said control computer being configured to generate said parameter map from said raw data of said at least three echo signals;
said computer being configured to use said parameter map to modify said MR data acquisition sequence with a modification selected from the group consisting of shimming a basic magnetic field of the magnetic resonance scanner, and to determine a current operating frequency of the magnetic resonance scanner, thereby producing an adjusted MR data acquisition sequence;
said computer being configured to generate electronic control signals corresponding to said adjusted MR data acquisition sequence and to provide said control signals to said magnetic resonance scanner with the examination subject situated therein in order to operate the magnetic resonance scanner so as to acquire diagnostic magnetic resonance data from said target volume with said adjusted MR data acquisition sequence; and
said computer being configured to reconstruct a diagnostic magnetic resonance image of the target volume from the acquired diagnostic magnetic resonance data, and to make the reconstructed diagnostic magnetic resonance image available from the computer in electronic form.

14. A non-transitory, computer-readable data storage medium for generating a parameter map for a target volume in an examination subject, said parameter map representing a field deviation from the resonance frequency of a first spectral component of selected tissue in the examination subject in a magnetic resonance scanner of a magnetic resonance tomography apparatus, said storage medium being loaded into a computerized controller of said magnetic resonance tomography apparatus, comprising a magnetic resonance scanner, and being encoded with programming instructions that cause said magnetic resonance tomography apparatus to:

operate the magnetic resonance scanner, while the examination subject is situated therein, in order to execute an MR data acquisition sequence in a preliminary scan of the examination subject so as to excite nuclear spins of said selected tissue in a spatial region of the examination subject, which comprises said target volume, to cause the excited nuclear spins to emit echo signals;

operate said magnetic resonance scanner to activate gradient fields to read out raw data from at least three echo signals, with a relative timing of the activation of said gradient fields being selected to produce a first echo time difference between two of said at least three echo signals that causes phase evolutions of signals of a second spectral component of said selected tissue to differ, during said first echo time difference, from phase evolutions of signals from said first spectral component of said selected tissue, substantially by $2\pi$, and with an echo time of at least a further one of said at least three echo signals selected to be between respective echo times of said two of said at least three echo signals that have said first echo time difference;

generate said parameter map from said raw data of said at least three echo signals;

use said parameter map to modify said MR data acquisition sequence with a modification selected from the group consisting of shimming a basic magnetic field of the magnetic resonance scanner, and determine a current operating frequency of the magnetic resonance scanner, thereby producing an adjusted MR data acquisition sequence;

generate electronic control signals corresponding to said adjusted MR data acquisition sequence and to provide said control signals to said magnetic resonance scanner with the examination subject situated therein in order to operate the magnetic resonance scanner so as to acquire diagnostic magnetic resonance data from said target volume with said adjusted MR data acquisition sequence; and reconstruct a diagnostic magnetic resonance image of the target volume from the acquired diagnostic magnetic resonance data, and make the reconstructed diagnostic magnetic resonance image available from the computer in electronic form.

* * * * *